United States Patent
Mizunashi

(10) Patent No.: US 10,800,920 B2
(45) Date of Patent: Oct. 13, 2020

(54) CURABLE ORGANOPOLYSILOXANE COMPOSITION

(71) Applicant: SHIN-ETSU CHEMICAL CO., LTD., Tokyo (JP)

(72) Inventor: Tomoyuki Mizunashi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 128 days.

(21) Appl. No.: 16/222,888

(22) Filed: Dec. 17, 2018

(65) Prior Publication Data

US 2019/0185671 A1 Jun. 20, 2019

(30) Foreign Application Priority Data

Dec. 18, 2017 (JP) .................. 2017-242005
Dec. 5, 2018 (JP) .................. 2018-227864

(51) Int. Cl.
| | |
|---|---|
| C08L 83/04 | (2006.01) |
| C08G 77/38 | (2006.01) |
| H01L 23/29 | (2006.01) |
| C08G 77/52 | (2006.01) |
| C08L 83/14 | (2006.01) |
| C08G 77/00 | (2006.01) |

(52) U.S. Cl.
CPC .............. *C08L 83/04* (2013.01); *C08G 77/38* (2013.01); *C08G 77/52* (2013.01); *C08G 77/80* (2013.01); *C08L 83/14* (2013.01); *H01L 23/296* (2013.01); *C08L 2203/206* (2013.01)

(58) Field of Classification Search
None
See application file for complete search history.

(56) References Cited

U.S. PATENT DOCUMENTS

| | | | | |
|---|---|---|---|---|
| 2,934,464 | A * | 4/1960 | Hoffman ................ | C08L 83/04 442/180 |
| 3,117,149 | A * | 1/1964 | Holdstock ............. | C08G 77/52 556/433 |
| 3,297,632 | A * | 1/1967 | Wu ........................ | C08G 77/04 528/37 |
| 4,463,118 | A * | 7/1984 | Evans .................... | C08L 83/10 524/264 |
| 10,266,648 | B2 * | 4/2019 | Alam .................... | C08G 64/42 |
| 2007/0099009 | A1 | 5/2007 | Shimizu et al. | |
| 2011/0278640 | A1 * | 11/2011 | Motallebi .............. | H01L 33/56 |
| 2015/0274895 | A1 * | 10/2015 | Okawa ................... | H01L 33/56 523/210 |
| 2016/0347997 | A1 * | 12/2016 | Tchoul ................. | C09K 11/7792 |
| 2017/0174843 | A1 * | 6/2017 | Kusunoki .............. | C08K 5/56 |
| 2017/0306098 | A1 * | 10/2017 | Kusunoki ............. | C08G 77/18 |

FOREIGN PATENT DOCUMENTS

| | | |
|---|---|---|
| JP | 2007-119569 A | 5/2007 |
| JP | 2011-219729 A | 11/2011 |
| JP | 2016-008246 A | 1/2016 |

* cited by examiner

*Primary Examiner* — Robert S Loewe
(74) *Attorney, Agent, or Firm* — Birch, Stewart, Kolasch & Birch, LLP

(57) ABSTRACT

The present invention provides a curable organosilicon resin composition showing excellent optical transparency, curability, heat resistance and light resistance. The present invention also provides a semiconductor device encapsulated with a cured product of such a composition. According to the invention, the curable organopolysiloxane composition comprises:

(A) an organopolysiloxane comprising at least 10 mol %, based on total moles of siloxane units, of a siloxane unit of the following formula (1):

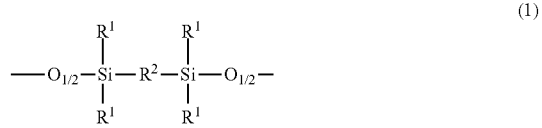

(1)

wherein $R^1$ is, independently at each occurrence, a monovalent hydrocarbon group having 1 to 10 carbon atoms, and $R^2$ is a divalent aromatic group having 6 to 50 carbon atoms and optionally comprising a silylene group or a siloxane linkage, and 10 to 90 mol % of $R^1SiO_{3/2}$ unit, the organopolysiloxane having a weight average molecular weight (Mw) of from 2,000 to 100,000, as determined by gel permeation chromatography relative to polystyrene standards, and a ratio of the weight average molecular weight (Mw) to the number average molecular weight (Mn) of at least 1.5; and (B) a catalytic amount of a basic catalyst.

9 Claims, No Drawings

CURABLE ORGANOPOLYSILOXANE COMPOSITION

CROSS REFERENCE

This application claims the benefits of Japanese Patent Application Nos. 2017-242005 filed on Dec. 18, 2017 and 2018-227864 filed on Dec. 5, 2018, the contents of which are hereby incorporated by reference.

TECHNICAL FIELD

The present invention relates to a curable organopolysiloxane composition, and a semiconductor device encapsulated with a cured product thereof.

BACKGROUND ART

To date, condensation-curable organopolysiloxanes have been widely used for various applications such as adhesives, water- and moisture-proof coating materials, electrical insulation films, and sealing materials for construction. In recent years, their use as an encapsulant for light emitting diodes (LED) has been attracting attention in view of their high heat resistance and light resistance. However, condensation-curable organopolysiloxanes have lower reactivity and, therefore, poor productivity, as compared with addition-curable organopolysiloxanes. A large amount of a condensation catalyst may be used to enhance their reactivity. However, this also accelerates degradation of these silicone resins, causing a problem that they no longer fully exhibit their intrinsic high heat resistance and light resistance. In addition, many condensation catalysts are unsuitable for fields where the heat resistance of the cured product has importance, because condensation catalysts themselves have a tinge of color or become to exhibit color upon deterioration.

Various attempts have been made for improvement and practical use of a condensation-curable organopolysiloxane. For example, JP 2011-219729A describes an approach to enhance the cure rate while minimizing degradation of the resin, by the addition of a condensation catalyst, such as a phosphate ester or a boron compound, in combination with a metal catalyst, such as aluminum or zinc, to a mixture of an organopolysiloxane having two or more silanol groups in a molecule and an organopolysiloxane having two or more alkoxy groups each bonded to a silicon atom in a molecule. As disclosed in JP 2016-008246A, another attempt is to reduce the amount of catalyst remaining in a cured product by curing a mixture of a partial hydrolysis of a tetraalkoxysilane or of a trialkoxysilane and a linear organopolysiloxane having a silanol group at each terminal by the addition of a volatile amine catalyst. Further, as disclosed in JP 2007-119569A, still another attempt is to achieve gelation with a reduced number of reactions by the use of a condensation-curable organopolysiloxane which is made to have a higher molecular weight in advance.

However, the condensation-curable organosilicon resin compositions disclosed in these prior art documents are still unsatisfactory for applications in the fields where high heat resistance and light resistance are required. For example, the curable organosilicon resin composition disclosed in JP 2011-219729A has poor heat resistance and light resistance due to the presence of a high level of the catalysts in the cured product, and is accompanied with gas evolution during curing by reaction byproducts due to the presence of the excessive amount of alkoxy groups in the composition, which may lead to the formation of voids. The resin composition disclosed in JP 2016-008246A has problems in storage stability and in handling, because the amine catalyst causes a condensation action even at a low temperature, resulting in an increase in the viscosity during storage. Further, in a case where a cured thick product is formed, another problem occurs, that is, the amine catalyst does not volatilize sufficiently, so that the remaining amine catalyst deteriorates upon heating, causing brown discoloration of the cured product. The composition described in JP 2007-119569A is unsuitable for applications where the composition needs to be put into a recess prior to the curing, because the condensation-curable organopolysiloxane is made to have a higher molecular weight in advance, so that the composition has a high viscosity.

SUMMARY OF INVENTION

In view of the circumstances described above, one of the objects of the present invention is to provide a curable organosilicon resin composition which has excellent optical transparency, curability, heat resistance and light resistance. Another object of the invention is to provide a semiconductor device comprising a semiconductor element encapsulated with the composition.

Through extensive research to attain the objects, the present inventor has found that a curable organopolysiloxane composition comprising a basic catalyst and a curable organopolysiloxane having a specific molecular weight distribution and comprising a specific amount of a siloxane unit of the following formula (1):

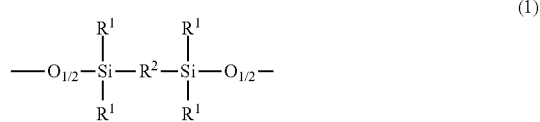

has excellent curability and can provide a cured product having high heat resistance and light resistance, and has completed the invention.

Thus, the present invention provides a curable organopolysiloxane composition comprising the following components:

(A) an organopolysiloxane comprising at least 10 mol %, based on total moles of siloxane units, of a siloxane unit of the following formula (1):

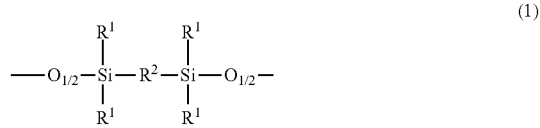

wherein $R^1$ is, independently at each occurrence, a monovalent hydrocarbon group having 1 to 10 carbon atoms, and $R^2$ is a divalent aromatic group having 6 to 50 carbon atoms and optionally comprising a silylene group or a siloxane linkage, and 10 to 90 mol % of $R^1SiO_{3/2}$ unit, the organopolysiloxane having a weight average molecular weight (Mw) of from 2,000 to 100,000, as determined by gel permeation chromatography relative to polystyrene standards, and a ratio of the weight average molecular weight (Mw) to the number average molecular weight (Mn) of at least 1.5; and (B) a catalytic amount of a basic catalyst.

The present invention further provides a semiconductor devise comprising a cured product of the above-described curable organopolysiloxane composition.

The curable organopolysiloxane composition according to the invention has excellent curability, and can provide a cured product having improved heat resistance and light resistance.

DESCRIPTION of PREFERABLE EMBODIMENTS

The present invention will be described in more detail.
(A) Curable Organopolysiloxane The curable organopolysiloxane (A) comprises at least 10 mol %, based on total moles of siloxane units, of a siloxane unit of the following formula (1):

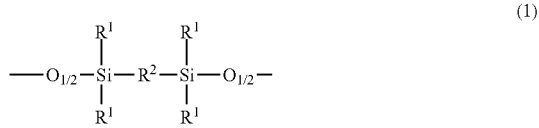

(1)

and 10 to 90 mol % of $R^1SiO_{3/2}$ unit. It may optionally comprise 0 to 50 mo % of $SiO_{4/2}$ unit, 0 to 70 mol % of $(R^1)_2SiO_{2/2}$ unit, and 0 to 30 mol % of $(R^1)_3SiO_{1/2}$ unit.

There is no particular limitation on the structure of the organopolysiloxane. However, the organopolysiloxane preferably has a ladder structure or a resin structure (three dimensional crosslinked structure), with one having a resin structure being particularly preferred.

The amount of the siloxane unit of formula (1) is at least 10 mol %, based on total moles of siloxane units in component (A), preferably from 10 to 90 mol %, and more preferably from 20 to 80 mol %. In the formula, $R^1$ is, independently at each occurrence, a monovalent hydrocarbon group having 1 to 10 carbon atoms, preferably 1 to 6 carbon atoms, and $R^2$ is a divalent aromatic group having 6 to 50 carbon atoms and optionally comprising a silylene group or a siloxane linkage.

Examples of $R^1$ include alkyl groups, such as methyl, ethyl, propyl and butyl groups; cycloalkyl groups, such as cyclohexyl group; aryl groups, such as phenyl, tolyl and xylyl groups; aralkyl groups, such as benzyl group; and alkenyl groups, such as vinyl, allyl, propenyl, isopropenyl, butenyl, hexenyl, cyclohexenyl and octenyl groups. These hydrocarbon groups may be partially or completely substituted with, e.g., a halogen atom. Among these, methyl and phenyl groups are preferred.

Examples of $R^2$ include arylene groups, such as phenylene and biphenylene groups; alkylarylene groups; diorganosilylene groups, such as dimethylsilylene group; groups having a siloxane linkage as represented by $(R^1)_2SiO_{2/2}$ unit (wherein $R^1$ is as defined above); and silylene groups having one or more silicon atoms or groups having one or more siloxane linkages as represented by the following formulas:

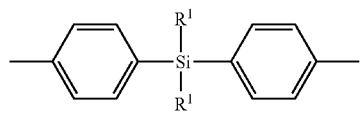

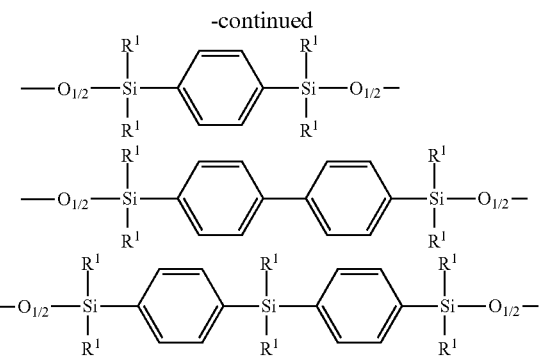

wherein $R^1$ is as defined above. Among these, silylene groups are preferred.

The organopolysiloxane has a weight average molecular weight of 2,000 to 100,000, preferably 3,000 to 50,000. If the molecular weight is lower than the lower limit indicated above, the resulting composition may not cure. If the molecular weight exceeds the upper limit indicated above, the resulting composition may have an undesirable pot life.

The organopolysiloxane is characterized by a ratio of the weight average molecular weight (Mw) to the number average molecular weight (Mn) of at least 1.5. Preferably, the Mw/Mn ratio is between 1.6 and 2.5. A polysiloxane having an Mw/Mn ratio less than the lower limit indicated above has undergone intra-molecular condensation during the polysiloxane synthesis stage and, accordingly, has a stable cage structure. Such a polysiloxane having a stable cage structure is less apt to further polymerize, resulting in a composition having poor curability. In contrast, an organopolysiloxane having an Mw/Mn ratio of at least 1.5 has active reaction points, so that it can cure instantly through the reaction between the molecules on account of the action of the basic catalyst described below.

As used herein, the weight average molecular weight (Mw) and the number average molecular weight (Mn) are those determined by gel permeation chromatography (GPC), relative to polystyrene standards, under the following conditions.

[Conditions]
Eluent: tetrahydrofuran (THF)
Flow rate: 0.6 mL/min
Detector: differential refractive index detector (RI)
Columns: TSK Guardcolumn SuperH-L
  TSKgel SuperH4000 (6.0 mm I.D.×15 cm×1)
  TSKgel SuperH3000 (6.0 mm I.D.×15 cm×1)
  TSKgel SuperH2000 (6.0 mm I.D.×15 cm×2)
  (All available from Tosoh Corp.)
Column temperature: 40° C.
Sample injection amount: 20 μL (0.5 wt % in a THF solution).

The organopolysiloxane having a molecular weight distribution described above shows two or more maxima, preferably 2 to 5 maxima, in a molecular weight distribution curve as obtained by GPC described above, and at least one maximum appears on a side of a molecular weight of 5,000 or more, preferably between 5,500 and 50,000, and at least one maximum appears on a side of a molecular weight Mw of 3,000 or less, preferably between 1,600 and 2,800. Further, in the molecular weight distribution curve of the organopolysiloxane (A), the ratio of the area of a peak having a maximum on a side of a molecular weight of 5,000 or more (hereinafter referred to as a peak on the higher molecular weight side) to the area of a peak having a maximum on a side of a molecular weight of 3,000 or less (hereinafter referred to as a peak on the lower molecular weight side) is preferably in a range of from 5:95 to 90:10, more preferably in a range of 20:80 to 70:30. If a peak on the higher molecular weight side overlaps with a peak on the lower molecular weight side, the areas of the two peaks are divided by a perpendicular line at a minimum between the two peaks. If the molecular weight distribution does not satisfy the criteria described above, the resulting composition may exhibit poor curability.

The molecular weight distribution curve may have a peak having a maximum between Mw 3,000 and 5,000. If the curve has three or more maxima, what is required is that a maximum of a largest molecular weight appears at Mw 5,000 or more, and a maximum of a smallest molecular weight appears at Mw 3,000 or less. In a case where there exists a peak having a maximum at a molecular weight between 3,000 and 5,000 and a combination of this peak with the peak on the higher molecular weight side has a weight average molecular weight of 5,000 or more, the area of the former peak is included in the area of the peak of the higher molecular weight side.

According to one embodiment, component (A) may comprise an alkoxy group bonded to a silicon atom in an amount ranging from 0.001 to 2 mol/100 g, and a hydroxyl group bonded to a silicon atom in an amount of from 0 mol/100 g to 1.0 mol/100 g. As used herein, the amounts of hydroxyl groups and alkoxy groups each bonded to a silicon atom are determined by $^1$H-NMR and $^{29}$Si-NMR.

The amount of hydroxyl group bonded to a silicon atom is preferably up to 0.8 mol/100 g, and more preferably up to 0.1 mol/100 g. The lower limit of the hydroxyl group is not particularly limited, and can be 0 mol/100 g. However, it is preferably at least 0.0001 mol/100 g. If the amount of hydroxyl group bonded to a silicon atom exceeds the upper limit indicated above, voids may occur upon curing.

The amount of alkoxy groups each bonded to a silicon atom is preferably between 0.02 and 1.5 mol/100 g, and more preferably up to 0.6 mol/100 g. If the amount of alkoxy groups each bonded to a silicon atom exceeds the upper limit indicated above, voids may occur upon curing. If it is less than the lower limit indicated above, the adhesiveness between the substrate and the cured product may be insufficient.

The organopolysiloxane may be in a state of solid, semisolid or liquid at 25° C.

According to the invention, the organopolysiloxane needs to comprise $R^1SiO_{3/2}$ unit in addition to the structure of formula (1) shown above. The amount of $R^1SiO_{3/2}$ unit (T unit) is 10 to 90 mol %, preferably 10 to 80 mol %, more preferably 30 to 80 mol %, relative to the total moles (100 mol % in total) of all siloxane units of component (A). If the organopolysiloxane does not have T unit, the resulting composition may exhibit poor curability. Optionally, the organopolysiloxane may comprise $SiO_{4/2}$ unit, $(R^1)_2SiO_{2/2}$ unit, or $(R^1)_3SiO_{1/2}$ unit, wherein $R^1$ is as already defined above. With regard to the contents of these units, the $SiO_{4/2}$ unit (Q unit) content may be from 0 to 20 mol %, preferably 0 to 10 mol %; the $(R^1)_2SiO_{2/2}$ unit (D unit) content may be from 0 to 70 mol %, preferably 0 to 50 mol %; and the $(R^1)_3SiO_{1/2}$ unit (M unit) content may be from 0 to mol %, preferably 0 to 20 mol %, and more preferably 0 mol %.

The organopolysiloxane according to the invention may be produced by subjecting organosilicon compounds as sources for the siloxane units mentioned above to a dehydrogenation, condensation or equilibration reaction. Any conventional method known in the art may be used for the production. Examples of the reaction catalyst include basic catalysts and acidic catalysts. However, it is preferable to use an acidic catalyst in order to obtain an organopolysiloxane having the molecular weight distribution as described above. If a basic catalyst is used, intra-molecular condensation may proceed during the polysiloxane synthesis stage, resulting in an organopolysiloxane having a stable cage structure with a ratio of the weight average molecular weight (Mw) to the number average molecular weight (Mn) (Mw/Mn ratio) of less than 1.5. As described above, such a polysiloxane having a stable cage structure is less apt to further polymerize, resulting in a composition having poor curability.

Examples of the material for obtaining $R^1SiO_{3/2}$ unit (T unit) include, but not limited to, organosilicon compounds, such as organotrichlorosilanes and organotrialkoxysilanes as represented by the formulas shown below; condensation products thereof; and organosilicon compounds comprising $HSiO_{2/2}$ unit which can be dehydrogenated by a boron catalyst.

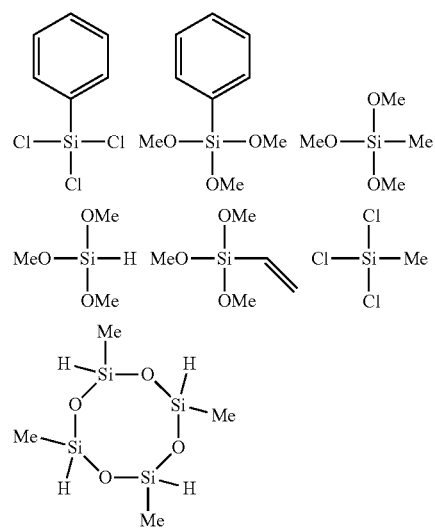

Examples of the material for obtaining $R^1_2SiO_{2/2}$ unit (D unit) include, but not limited to, organosilicon compounds, such as diorganodichlorosilanes and diorganodialkoxysilanes as represented by the formulas shown below.

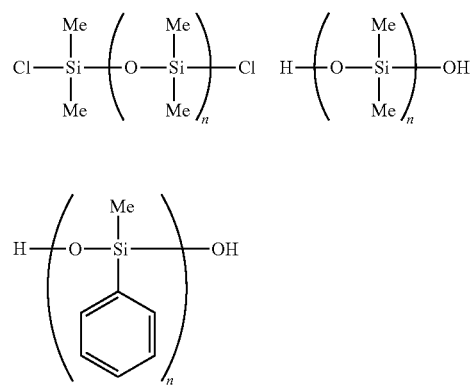

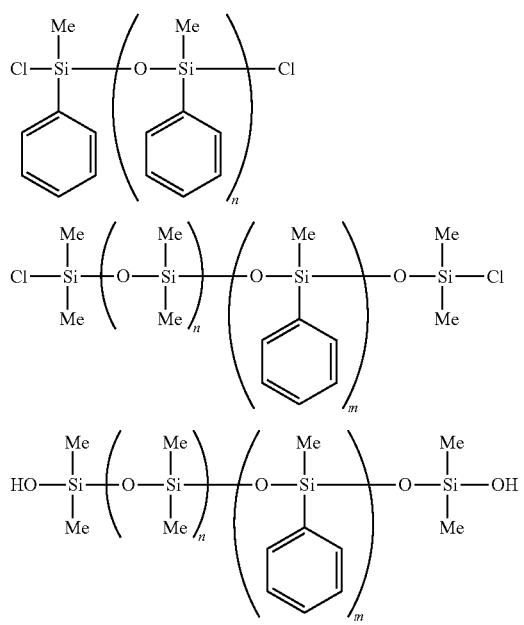

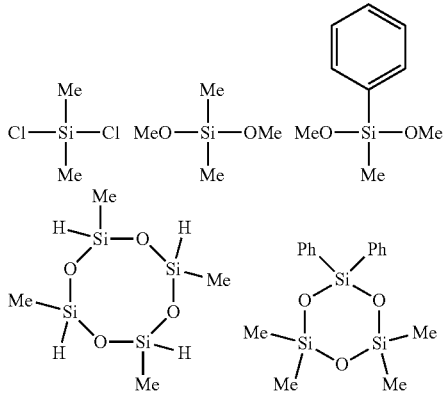

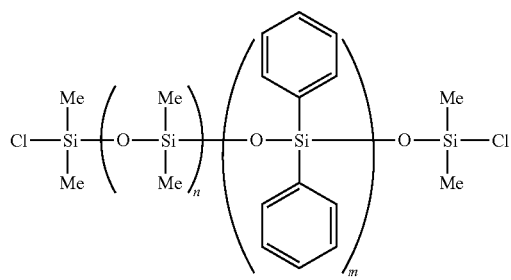

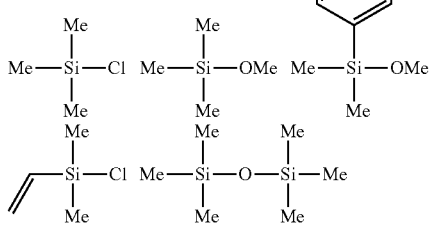

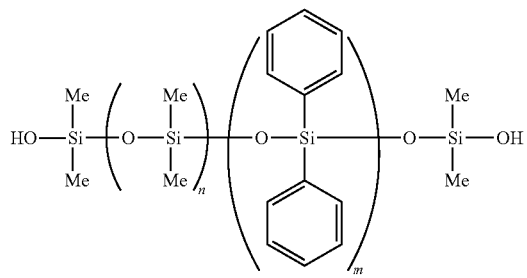

wherein n is an integer of 0 to 100, and m is an integer of 0 to 100.

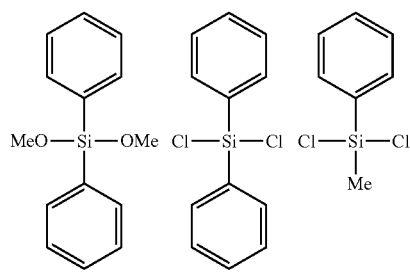

Examples of the material for obtaining $R^{13}SiO_{1/2}$ unit (M unit) include, but not limited to, organosilicon compounds, such as triorganochlorosilanes, triorganoalkoxysilanes, and hexaorganodisiloxanes as represented by the formulas shown below.

Examples of the material for obtaining $SiO_{4/2}$ unit include, but not limited to, sodium silicate, tetraalkoxysilanes, and condensation products thereof.

Examples of the material for obtaining the unit of formula (1) include, but not limited to, organosilicon compounds, such as 1,4-bis(dimethylsilyl)benzenes, as represented by the formulas shown below.

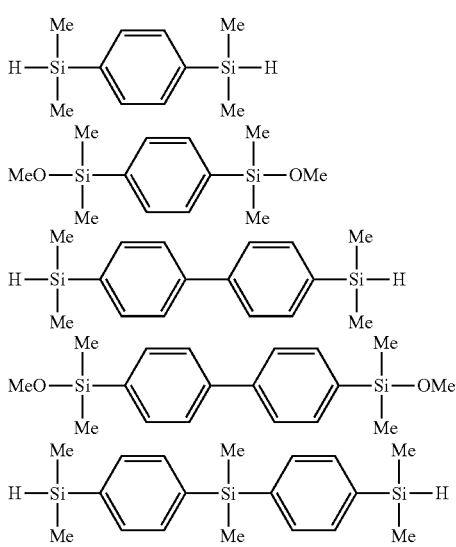

(B) Basic Catalyst

Component (B) is a basic catalyst, and acts to promote the condensation reaction at a hydroxyl group bonded to a silicon atom of the organopolysiloxane or the equilibration polymerization of the organopolysiloxane. The basic catalyst may be any known catalyst conventionally used for condensation reaction of siloxane.

Examples of the basic catalyst include amine compounds, silicates, and metal compounds such as zirconium, titanium, tin, lithium, barium, zinc and iron. Examples of the amine compound include primary alkylamines, such as methylamine, ethylamine, n-propylamine, isopropylamine, n-butylamine, isobutylamine, t-butylamine, n-pentylamine, neopentylamine, n-hexylamine, cyclopropylamine, and cyclohexylamine; secondary alkylamines such as, dimethylamine, diethylamine, di-n-propylamine, diisopropylamine, diisopropylethylamine, di-n-butylamine, methylethylamine, methylpropylamine, ethylpropylamine, methylisobutylamine, diisobutylamine, di-t-butylamine, and methylpentylamine; tertiary alkylamine, such as triethylamine, tri-n-propylamine, tri-n-butylamine, N-ethyldipropylamine, tributylamine, and trihexylamine; silazanes and polysilazanes. Examples of the metal compound include alkoxides or carboxylic acid complexes of lead, tin, zinc, iron, zirconium, titanium, cerium, calcium and barium, such as diisopropoxy barium; and alkali metal silicates, such as lithium silicate, sodium silicate, and potassium silicate. Among these, amine compounds, such as di-n-butylamine, N-ethyldipropylamine, tri-n-butylamine, silazanes and polysilazanes; alkoxides or carboxylic acid complexes of tin, zinc, zirconium and calcium; and alkali metal silicates, such as lithium silicate, sodium silicate, and potassium silicate are preferred.

The amount of the basic catalyst may be a catalytic amount to allow the reaction to proceed, preferably in a range of from 0.001 to 5 parts by mass, more preferably in a range of from 0.005 to 3 parts by mass, relative to 100 parts by mass of component (A). An excessive amount of the catalyst may result in cured products having poor heat and/or light resistance.

(C) Linear Organopolysiloxane

The curable organopolysiloxane composition according to the invention may further comprise (C) a linear organopolysiloxane. The amount of component (C) may be less than 50 parts by mass, preferably in a range of from 1 to 50 parts by mass, more preferably in a range of from 1 to 30 parts by mass, relative to 100 parts by mass of component (A).

Component (C) is preferably a diorganopolysiloxane having a one silanol group at each terminal. The linear organopolysiloxane is preferably represented by the following formula (2):

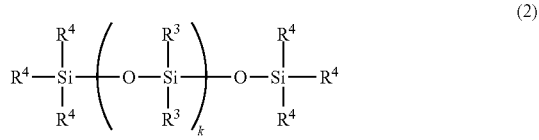

(2)

wherein k is an integer of 1 to 10,000, $R^3$ is, independently at each occurrence, a monovalent hydrocarbon group having 1 to 10 carbon atoms, and $R^4$ is, independently at each occurrence, a group selected from a hydroxyl group, an alkoxy group having 1 to 10 carbon atoms, and a monovalent hydrocarbon group having 1 to 10 carbon atoms, or a hydrogen atom.

In the above formula, $R^3$ is, independently at each occurrence, a monovalent hydrocarbon group having 1 to 10 carbon atoms. Examples of the monovalent hydrocarbon group include saturated aliphatic hydrocarbon groups, such as methyl, ethyl, propyl, butyl and pentyl groups; alicyclic hydrocarbon groups, such as cyclopentyl and cyclohexyl groups: unsaturated aliphatic hydrocarbon groups, such as vinyl, allyl, 5-hexenyl and 9-decenyl groups; aromatic hydrocarbon groups, including aryl groups, such as phenyl and tolyl groups, and aralkyl groups, such as benzyl, phenylethyl and phenylpropyl groups; and derivatives of these groups in which a part or all of hydrogen atoms each bonded to a carbon atom of these groups are substituted with a halogen atom, such as fluorine, bromine and chlorine atoms, including, for example, halogenated monovalent hydrocarbon groups, such as trifluoropropyl and chloropropyl groups. Among these, a saturated hydrocarbon group having 1 to 5 carbon atoms, such as methyl, ethyl and propyl groups, and phenyl group are preferred. Examples of $R^4$ include, in addition to those groups listed above for $R^3$, a hydrogen atom, and hydroxyl, methoxy, ethoxy, isopropoxy and butoxy groups. Among these, hydroxyl, methoxy, methyl and phenyl groups are preferred.

Examples of component (C) include organopolysiloxanes of the formulas shown below.

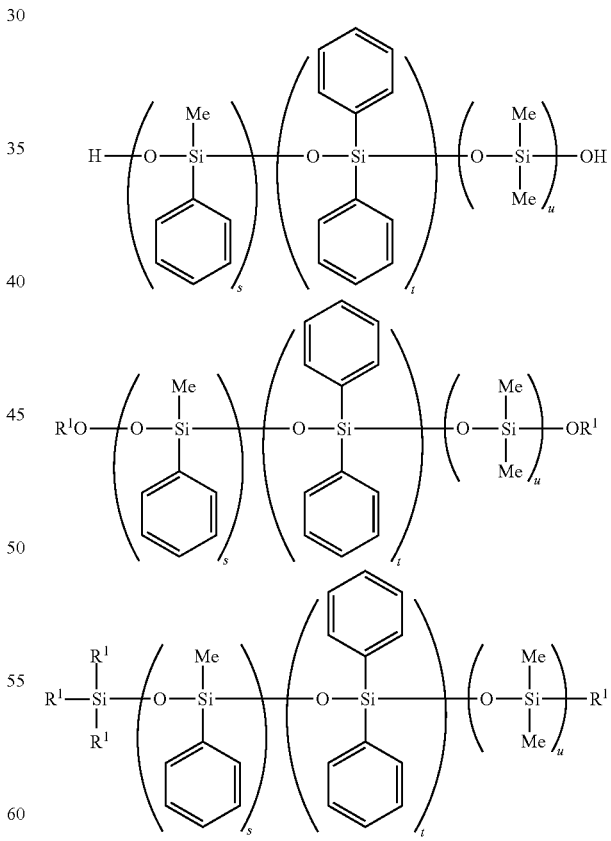

wherein s, t and u are each an integer of 0 to 10,000, provided that s+t+u equals to 1 to 10,000.

(D) Cyclic Organopolysiloxane

The curable organopolysiloxane composition according to the invention may further comprise (D) a cyclic organopolysiloxane. Preferably, the organopolysiloxane is an organosilicon compound of the following formula (3):

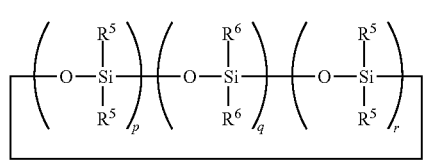

(3)

wherein $R^5$ is, independently at each occurrence, a monovalent aliphatic hydrocarbon group having 1 to 10 carbon atoms, $R^6$ is, independently at each occurrence, a monovalent aromatic hydrocarbon group having 6 to 10 carbon atoms, and p, q and r are, independently from each other, an integer of 0 to 4, provided that p+q+r equals to 3 or 4.

In particular, a cyclic organopolysiloxane of the following formula (4) is preferred.

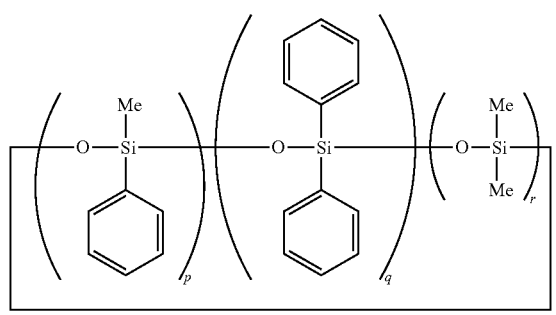

(4)

wherein p, q and r are as defined above.

The cyclic organopolysiloxane may be liquid or solid at normal temperature, and even if this compound is solid, a liquid ring-opened polymer can be obtained by the reaction with an amine compound or a metal compound of zirconium, titanium, tin, zinc and iron, as described above on the basic catalyst. The compound of the formula (3) can also be readily mixed, because it liquefies by combining it with component (A) followed by heating at a temperature of 50° C. to 200° C. while mixing.

The amount of the cyclic organopolysiloxane is preferably in a range of from 0.1 to 30 parts by mass, and more preferably in a range of from 0.2 to 20 parts by mass, relative to 100 parts by mass of component (A).

(E) Phosphor

The curable organopolysiloxane composition according to the invention may further comprise (E) a phosphor. The curable organopolysiloxane composition according to the invention has excellent resistance to heat and light, so that, even if it contains a phosphor, significant decline in the fluorescent characteristics conventionally observed is unlikely to happen.

There is no particular limitation on the phosphor, and any phosphor known in the art may be used. For example, preferred are those that absorb light emitted from a semiconductor element, in particular a semiconductor light-emitting diode comprising a nitride-based semiconductor as a light emitting layer, and that cause wavelength conversion to emit light at a different wavelength. Such a phosphor is preferably at least one material selected from, for example, nitride- and oxynitride-based phosphors activated mainly with a lanthanide element, such as Eu or Ce; alkaline earth metal halogen apatite phosphors, alkaline earth metal borate halogen phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors, or germanate phosphors, each activated mainly with a lanthanide element such as Eu or a transition metal element such as Mn; or rare earth aluminate phosphors or rare earth silicate phosphors, each activated mainly with a lanthanide element such as Ce; organic or organic complex phosphors activated mainly with a lanthanide element such as Eu; or Ca—Al—Si—O—N oxynitride glass phosphors.

The phosphor preferably has an average particle size of at least 10 nm, more preferably 10 nm to 10 μm, and still more preferably 10 nm to 1 μm. The particle size is determined by particle size distribution measurement using a laser light diffraction method, e.g., with a Cilas laser analyzer. The amount of the phosphor may be in a range from 0.1 to 2,000 parts by mass, and more preferably in a range of 0.1 to 100 parts by mass, relative to 100 parts by mass of the other components, e.g., component (A).

Other Optional Components

In addition to components (A) to (E), the curable organopolysiloxane composition may further comprise, if necessary, one or more adhesion promoters and other additives.

Any known adhesion promoter may be used, for example, phenyltrimethoxysilane, trimethoxysilane, triethoxysilane, methyldimethoxysilane, diphenyldimethoxysilane, methylphenyldimethoxysilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, 3-methacryloxypropylmethyldiethoxysilane, 3-methacryloxypropyltriethoxysilane, N-2(aminoethyl)3-aminopropylmethyldimethoxysilane, N-2 (aminoethyl)3-aminopropyltrimethoxysilane, N-2 (aminoethyl)3-aminopropyltriethoxysilane, N-phenyl-3-aminopropyltrimethoxysilane, 3-mercaptopropyltrimethoxysilane, 3-isocyanatopropyltriethoxysilane, 3-cyanopropyltriethoxysilane, and oligomers thereof. Such an adhesion promoter may be used alone or in combination. The amount of the adhesion promoter is preferably in the range of from 0.01 to 10 parts by mass, in particular from 0.05 to 5 parts by mass, relative to 100 parts by mass of component (A).

Examples of other additives include reinforcing inorganic fillers, such as silica, glass fibers, and fumed silica; non-reinforcing inorganic fillers, such as calcium carbonate, calcium silicate, titanium dioxide, ferric oxide, carbon black, and zinc oxide; and nanofillers, such as silicon dioxide (silica: $SiO_2$), zirconium oxide (zirconia: $ZrO_2$), titanium oxide ($TiO_2$), aluminum oxide (alumina: $Al_2O_3$), zinc oxide (ZnO), iron oxide ($Fe_2O_3$), triiron tetraoxide ($Fe_3O_4$), lead oxide ($PbO_2$), tin oxide ($SnO_2$), cerium oxide ($Ce_2O_3$, $CeO_2$), calcium oxide (CaO), trimanganese tetraoxide ($Mn_3O_4$), and magnesium oxide (MgO). The amount of the additive may be suitably adjusted, as far as such does not impair the effects of the present invention. For example, such may be used in an amount of up to 600 parts by mass, preferably from 1 to 600 parts by mass, more preferably 10 to 400 parts by mass, relative to 100 parts by mass of component (A).

The curable organopolysiloxane composition according to the invention is liquid or solid at normal temperature (25° C.). While the curable organopolysiloxane composition according to the invention can be cured satisfactorily at normal temperature (25° C.), it may be heated to cure if necessary. The temperature for heating may be, for example, between 60 and 200° C. Depending on the intended use, it may be applied to a predetermined substrate prior to curing.

The curable organopolysiloxane composition according to the invention preferably has a time for the composition in a liquid state to gelate at 150° C. of less than 300 seconds, and more preferably from 30 to 240 seconds. When it has a gelation time of less than 300 seconds, it exhibits excellent curability and is suitable as a molding material for compression molding or transfer molding. As used herein, the term "gelation" or "gelate" means a state of a substance which has no fluidity while not yet solid, and the term "time to gelate" means a time for a liquid composition to lose fluidity. As described above, the resin composition of the invention is liquid or solid at normal temperature, but such a solid composition becomes liquid at 150° C. Thus, for a composition which is solid at room temperature, "a time for the composition in a liquid state to gelate at 150° C." means a time for the composition to gelate (to lose fluidity) after becoming liquid at 150° C. When no or insufficient gelation occurs at 150° C. and at 300 seconds, the resin strength may become too weak under molding conditions, so that the molded product may break under the stress received from a metal mold during the removal from the metal mold. In contrast, a composition which gelates at 150° C. within 300 seconds is preferable, as it has appropriate resin strength under molding conditions and can withstand the stress during removal from the metal mold.

The resin composition has an amount of volatile components at 150° C. for 1 hour of preferably up to 10% by weight, more preferably between 0.01 and 5% by weight. The amount of volatile components of up to 10% by weight is preferred, because generation of voids can be avoided during curing and cure shrinkage can be suppressed. It is noted that the amount of volatile components (%) corresponds to a weight loss (%) of the composition after heating relative to the amount of the composition before heating.

The curable organopolysiloxane composition according to the invention provides a cured product having excellent mechanical properties, crack resistance, and heat resistance. Preferably, the curable organopolysiloxane composition according to the invention shows, when cured to a thickness of 1 mm, a total light transmittance over a wavelength range of 400 to 800 nm, 6 in particular a light transmittance at a wavelength of 450 nm, of 70% or more, more preferably 80% or more. As used herein, the total light transmittance refers to a value determined according to a method described in JIS K 7361-1:1999, and the light transmittance at 450 nm refers to a value determined by a modified method of the aforementioned standard with a spectrophotometer U-4100 made by Hitachi.

Also, the curable organopolysiloxane composition according to the invention can provide a cured product having a refractive index of 1.40 to 1.70, preferably 1.45 to 1.56. As used herein, the refractive index refers to a value determined at 25° C. according to JIS K 7142:2008, and can be measured with an Abbe-type refractometer.

The cured product having such a transmittance and refractive index as described above has excellent optical transparency and therefore may be suitably used for optical applications, such as encapsulant for LED.

Semiconductor Device

The present invention also provides a semiconductor device comprising a semiconductor element encapsulated with a cured product of the curable organopolysiloxane composition described above.

As described above, the cured product obtained from the curable organopolysiloxane composition according to the invention has excellent optical transparency and heat resistance. It is therefore suitable as a lens material, a protective coating material or a molding material for a light emitting semiconductor device, in particular for encapsulating LED elements, such as blue LED, white LED and ultraviolet LED. Further, the curable organopolysiloxane composition according to the invention has excellent heat resistance, so that it can secure prolonged reliability under high humidity even when used as a material for a wavelength conversion film by the addition of a silicate-based phosphor or a quantum dot phosphor, and can provide a light emitting semiconductor device with good moisture resistance and long-term color rendering properties.

In a case where a semiconductor device, such as LED, is encapsulated with the curable organopolysiloxane composition according to the invention, the curable organopolysiloxane composition may be applied to, for example, an LED element mounted on a pre-molded package of a thermoplastic resin, and then cured on the LED element, to obtain the LED element encapsulated with a cured product of the curable organopolysiloxane composition according to the invention. It is also possible to apply the composition to the LED element in the form of varnish prepared by dissolving the composition in an organic solvent, such as toluene or xylene. The amount of the organic solvent may be suitably adjusted according to a conventional method known in the art.

The curable organopolysiloxane composition according to the invention has excellent properties, such as optical transparency, heat resistance, UV resistance, crack resistance and long-term reliability, and are, therefore, suitably used as materials for optical applications, such as materials for displays, optical recording media, optical apparatus, optical parts and optical fibers, optical and electronic functional organic materials, and peripheral materials for semiconductor integrated circuits.

EXAMPLES

The invention will be further described with reference to the following Examples and Comparative Examples, which should not to be construed to limit the scope of the present invention. It is noted that part is in mass, and viscosity was determined at 25° C. Hereinafter, Me stands for methyl group, Ph stands for phenyl group, and Mw stands for weight average molecular weight. The weight average molecular weight (Mw) and the number average molecular weight (Mn) were determined by gel permeation chromatography (GPC) relative to polystyrene standards. Detailed conditions are as described above.

Example 1

Curable organopolysiloxane composition 1 was prepared by mixing (A) 100 parts by mass of a phenylmethylpolysiloxane having a ladder structure comprised of 50 mol % of $PhSiO_{3/2}$ unit, 30 mol % of $PhMeSiO_{2/2}$ unit and 20 mol % of the siloxane unit of the following formula (5):

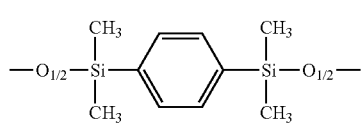

(5)

with a proviso that a part of the substituents of the polysiloxane were hydroxyl or alkoxy groups (the same applies hereinafter), with (B) 1 part by mass of lithium silicate.

The organopolysiloxane (A) had a weight average molecular weight (Mw) of 5,400, and a ratio of the weight average molecular weight Mw to the number average molecular weight Mn of 1.7. It contained a hydroxyl group in an amount of 0.1 mol/100 g and a methoxy group in an amount of 0.6 mol/100 g, each bonded to a silicon atom. Also, it had two peaks in the molecular weight distribution curve obtained by GPC, one peak having a maximum at a position corresponded to a molecular weight of 9,900 on the higher molecular weight side, and the other peak having a maximum at a position corresponded to a molecular weight of 1,600 on the lower molecular weight side, and a ratio of the area of the peak on the higher molecular weight side to the area of the peak on the lower molecular weight side was 46:54.

Example 2

Curable organopolysiloxane composition 2 was prepared by repeating the procedures of Example 1, except that component (A) was a phenylmethylpolysiloxane having a resin structure comprised of 40 mol % of $MeSiO_{3/2}$ unit, mol % of $PhSiO_{3/2}$ unit, 10 mol % of $Ph_2SiO_{2/2}$ unit and 10 mol % of the siloxane unit of the following formula (5):

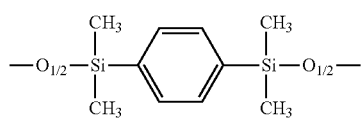

(5)

The organopolysiloxane (A) had a weight average molecular weight (Mw) of 2,000, and a ratio of the weight average molecular weight Mw to the number average molecular weight Mn of 1.5. It had two peaks in the molecular weight distribution curve obtained by GPC, one peak having a maximum at a position corresponded to a molecular weight of 5,400 on the higher molecular weight side, and the other peak having a maximum at a position corresponded to a molecular weight of 1,300 on the lower molecular weight side, and a ratio of the area of the peak on the higher molecular weight side to the area of the peak on the lower molecular weight side was 5:95. It contained a hydroxyl group in an amount of 0.02 mol/100 g, a methoxy group in an amount of 0.3 mol/100 g, and an isopropoxy group in an amount of 0.01 mol/100 g, each bonded to a silicon atom.

Example 3

Curable organopolysiloxane composition 3 was prepared by mixing (A) 100 parts by mass of a phenylmethylpolysiloxane having a ladder structure comprised of 30 mol % of $MeSiO_{3/2}$ unit and 70 mol % of the siloxane unit of the following formula (5):

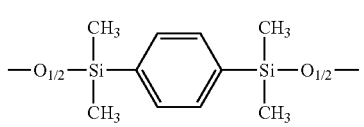

(5)

with (B) 0.05 part by mass of diisopropoxy barium.

The organopolysiloxane had a weight average molecular weight Mw of 98,000, and a ratio of the weight average molecular weight Mw to the number average molecular weight Mn of 2.0. It had three peaks in the molecular weight distribution curve obtained by GPC, two peaks having maxima at positions corresponded to molecular weights of 200,400 and 8,700 on the higher molecular weight side, and one peak having a maximum at a position corresponded to a molecular weight of 1,600 on the lower molecular weight side, and a ratio of the area of the peak on the higher molecular weight side to the area of the peak on the lower molecular weight side was 90:10. It contained a hydroxyl group in an amount of 0.02 mol/100 g, a methoxy group in an amount of 0.3 mol/100 g, and an isopropoxy group in an amount of 0.01 mol/100 g, each bonded to a silicon atom.

Example 4

Curable organopolysiloxane composition 4 was prepared by repeating the procedures of Example 1, except that 50 parts by mass, relative to 100 parts by mass of component (A), of a linear organopolysiloxane of the formula (6) shown below was further added as component (C) to the composition of Example 1

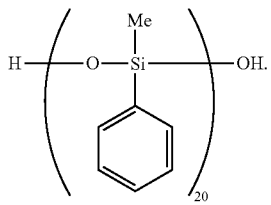

(6)

Example 5

Curable organopolysiloxane composition 5 was prepared by repeating the procedures of Example 1, except that 20 parts by mass, relative to 100 parts by mass of component (A), of an organosilicon compound of the formula (7) shown below was further added as component (D) to the composition of Example 1

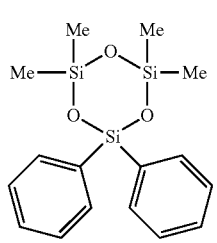

(7)

Example 6

Curable organopolysiloxane composition 6 was prepared by repeating the procedures of Example 1, except that component (A) was a phenylmethylpolysiloxane having a ladder structure and comprised of 40 mol % of $MeSiO_{3/2}$ unit, 30 mol % of $PhSiO_{3/2}$ unit, and 30 mol % of the siloxane unit of the following formula (5):

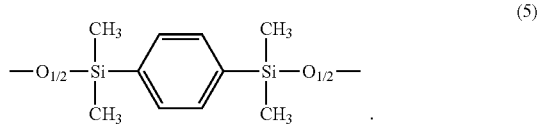

(5)

The phenylmethylpolysiloxane had a weight average molecular weight (Mw) of 9,500, and a ratio of the weight average molecular weight Mw to the number average molecular weight Mn of 1.5. It had two peaks in the molecular weight distribution curve obtained by GPC, one peak having a maximum at a position corresponded to a molecular weight of 20,200 on the higher molecular weight side, and the other peak having a maximum at a position corresponded to a molecular weight of 2,600 on the lower molecular weight side, and a ratio of the area of the peak on the higher molecular weight side to the area of the peak on the lower molecular weight side was 50:50. It contained a hydroxyl group in an amount of 0.01 mol/100 g and a methoxy group in an amount of 0.0005 mol/100 g, each bonded to a silicon atom.

Comparative Example 1

A curable organopolysiloxane composition 7 was prepared by repeating the procedures of Example 1, except that component (A) was replaced with a phenylmethylpolysiloxane having a resin structure comprised of 50 mol % of $MeSiO_{3/2}$ unit, 20 mol % of $PhSiO_{3/2}$ unit, and 30 mol % of $Ph_2SiO_{2/2}$ unit.

The phenylmethylpolysiloxane had a weight average molecular weight (Mw) of 5,000, and a ratio of the weight average molecular weight Mw to the number average molecular weight Mn of 1.5. It had two peaks in the molecular weight distribution curve obtained by GPC, one peak having a maximum at a position corresponded to a molecular weight of 6,900 on the higher molecular weight side, and the other peak having a maximum at a position corresponded to a molecular weight of 2,600 on the lower molecular weight side, and a ratio of the area of the peak on the higher molecular weight side to the area of the peak on the lower molecular weight side was 41:59. It contained a hydroxyl group in an amount of 0.9 mol/100 g and a methoxy group in an amount of 0.003 mol/100 g, each bonded to a silicon atom.

Comparative Example 2

A curable organopolysiloxane composition 8 was prepared by repeating the procedures of Example 1, except that component (A) was replaced with a phenylmethylpolysiloxane having a resin structure comprised of 92 mol % of $PhSiO_{3/2}$ unit and 8 mol % of the siloxane unit of the following formula (5):

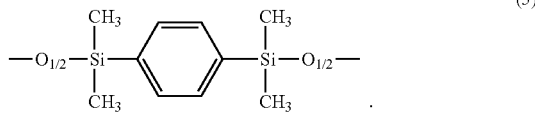

(5)

The phenylmethylpolysiloxane had a weight average molecular weight (Mw) of 4,200, and a ratio of the weight average molecular weight Mw to the number average molecular weight Mn of 1.5. It had two peaks in the molecular weight distribution curve obtained by GPC, one peak having a maximum at a position corresponded to a molecular weight of 5,900 on the higher molecular weight side, and the other peak having a maximum at a position corresponded to a molecular weight of 1,600 on the lower molecular weight side, and a ratio of the area of the peak on the higher molecular weight side to the area of the peak on the lower molecular weight side was 52:48. It contained a hydroxyl group in an amount of 0.1 mol/100 g and a methoxy group in an amount of 1.6 mol/100 g, each bonded to a silicon atom.

Comparative Example 3

Curable organopolysiloxane composition 9 was prepared by repeating the procedures of Example 1, except that component (A) was replaced with a linear phenylmethylpolysiloxane comprised of 50 mol % of $MePhSiO_{2/2}$ unit and 50 mol % of the siloxane unit of the following formula (5):

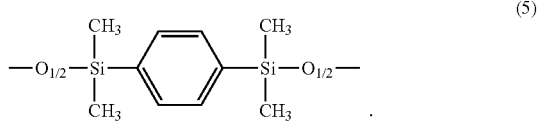

(5)

The phenylmethylpolysiloxane had a weight average molecular weight (Mw) of 18,200, and a ratio of the weight average molecular weight Mw to the number average molecular weight Mn of 1.3.

It had one peak in the molecular weight distribution curve obtained by GPC, and contained a hydroxyl group in an amount of 0.01 mol/100 g and a methoxy group in an amount of 0.02 mol/100 g, each bonded to a silicon atom.

Comparative Example 4

Curable organopolysiloxane composition 10 was prepared by repeating the procedures of Example 1, except that component (A) was replaced with a phenylmethylpolysiloxane having a resin structure comprised of 75 mol % of $PhSiO_{3/2}$ unit and 25 mol % of the siloxane unit of the following formula (5):

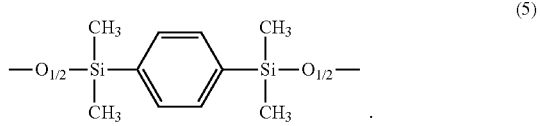

(5)

The phenylmethylpolysiloxane had a weight average molecular weight (Mw) of 2,800, and a ratio of the weight average molecular weight Mw to the number average molecular weight Mn of 1.3.

It had two peaks in the molecular weight distribution curve obtained by GPC, both peaks having maxima at positions corresponded to molecular weights of 3,000 and 1,600, but did not have any peak having a maximum in a molecular weight range of 5,000 or more. It contained a hydroxyl group in an amount of 0.1 mol/100 g and a methoxy group in an amount of 1.6 mol/100 g, each bonded to a silicon atom.

Physical properties were evaluated by the methods described below on curable organopolysiloxane compositions 1 to 10 prepared in the Examples and Comparative Examples described above and on the cured products obtained from each of the compositions. The results are shown in Tables 1 and 2.

(1) Appearance

The color and optical transparency were visually inspected on a cured product (1 mm thick) obtained by curing each composition at 150° C. for 4 hours.

(2) State

Fluidity was examined on each of the compositions before cured. Fifty grams of the composition was placed in a 100 ml glass bottle. The bottle was laid down and left at 25° C. for 10 minutes. The composition was judged liquid if it flowed out from the bottle during that period.

(3) Refractive Index

The refractive index was determined at 589 nm and at 25° C. according to JIS K 7142:2008, with an Abbe-type refractometer on a cured product with a thickness of 0.5 mm obtained by curing each composition at 150° C. for 4 hours.

(4) Hardness (Type D)

The hardness was determined according to JIS K 6249:2003, with a durometer D hardness tester on a cured product obtained by curing each composition at 150° C. for 4 hours.

(5) Elongation at Break and Tensile Strength

The elongation at break and tensile strength were determined according to JIS K 6249:2003 on a cured product obtained by curing each composition at 150° C. for 4 hours.

(6) Heat Resistance (Retention of Light Transmittance) and Crack Resistance

The light transmittance (initial transmittance) was measured at 450 nm and at 23° C. with a Hitachi spectrophotometer U-4100 on a cured product (1 mm thick) obtained by curing each composition at 150° C. for 4 hours. Then, the cured product was subjected to a heat treatment at 250° C. for 1,000 hours, followed by measurement of the light transmittance in the same manner. Percentage of the light transmittance after the heat treatment relative to the initial transmittance (100%) was calculated. Further, visual inspection was carried out on the cured product after the heat treatment to examine occurrence of cracks. Those having no cracks were rated good (G), and those having cracks were rated bad (B).

(7) Non-Volatility

One gram of each composition was placed in an aluminum dish and subjected to a heat treatment at 150° C. for one hour. The cured product after the heat treatment was weighed. Percentage of the weight after the heat treatment relative to the weight before the heat treatment (100%) was shown in Tables 1 and 2.

(8) Adhesiveness

On a silver-plated plate of an area of 180 mm$^2$, 0.5 gram of each composition was molded to have a base area of 45 mm$^2$ and was cured at 150° C. for 4 hours. The cured product was broken by a micro spatula and torn off from the silver plate. The percentages of cohesive failure to peeled portion were determined. Adhesiveness was evaluated on the following criteria.

(Evaluation Criteria)

Good adhesiveness (G): the percentage of cohesive failure was 80% or more;

Modest adhesiveness (M): the percentage of cohesive failure was at least 50% and less than 80%;

Poor adhesiveness (B): the percentage of cohesive failure was less than 50%.

(9) Dust Deposition Due to Surface Tackiness

The cured product obtained by curing each composition at 150° C. for 4 hours was visually inspected for the presence of dust deposited on its surface.

(10) Curability (Gelation)

One gram of each composition was subjected to molding at 150° C. for 300 seconds with a molding equipment, FFT-1030 manufactured by TOWA Corp., to see if a resin molded product was obtained on a glass epoxy substrate. The moldability was evaluated on the following criteria.

(Evaluation Criteria)

G: normal molding without peeling or resin rupture (sufficient gelation)

B: occurrence of peeling or resin rupture (insufficient gelation)

TABLE 1

| | Examples | | | | | |
|---|---|---|---|---|---|---|
| | 1 | 2 | 3 | 4 | 5 | 6 |
| Appearance | clear and colorless | clear and colorless | clear and colorless | clear and colorless | clear and colorless | clear and colorless |
| State | liquid | liquid | solid | liquid | liquid | liquid |
| Viscosity (Pa · s) | 60 | 20 | — | 15 | 8 | 37 |
| Refractive Index | 1.53 | 1.51 | 1.46 | 1.53 | 1.51 | 1.51 |
| Hardness (Type D) [150° C. × 4 h] | 45 | 60 | 20 | 40 | 50 | 50 |
| Elongation at break (%) | 40 | 30 | 60 | 60 | 45 | 35 |
| Tensile strength (MPa) | 7 | 10 | 5 | 3 | 4 | 2 |
| Light transmittance (%) Initial | 100 | 100 | 100 | 100 | 100 | 100 |
| Light transmittance (%) After heat treatment | 100 | 100 | 100 | 100 | 100 | 100 |
| Weight (%) after heat treatment relative to the weight before heat treatment (100%) | 97 | 98 | 96 | 96 | 95 | 95 |
| Dust deposition due to surface tackiness | no | no | no | no | no | no |
| Curability (gelation) [150° C. × 300 sec] | G | G | G | G | G | G |

TABLE 1-continued

| | Examples | | | | | |
|---|---|---|---|---|---|---|
| | 1 | 2 | 3 | 4 | 5 | 6 |
| Crack resistance | G | G | G | G | G | G |
| Adhesiveness (Ag) | G | G | G | G | G | M |

TABLE 2

| | Comparative Examples | | | |
|---|---|---|---|---|
| | 1 | 2 | 3 | 4 |
| Appearance | clear and colorless liquid | clear and colorless liquid | clear and colorless liquid | clear and colorless liquid |
| State | | | | |
| Viscosity (Pa · s) | 75 | 20 | 5 | 30 |
| Refractive Index | 1.53 | 1.56 | 1.53 | 1.55 |
| Hardness (Type D) [150° C. × 4 h] | 60 | 63 | — | 20 (voids) |
| Elongation at break (%) | 5 | 10 | — | 20 |
| Tensile strength (MPa) | 6 | 7 | — | 1 |
| Light transmitance (%) Initial | 100 | 100 | — | 100 |
| Light transmitance (%) After heat treatment | 100 | 100 | — | 100 |
| Weight (%) after heat treatment relative to the weight before heat treatment (100%) | 92 | 95 | — | 85 |
| Dust deposition due to surface tackiness | no | no | — | yes |
| Curability (gelation) [150° C. × 300 sec] | B | B | B | B |
| Crack resistance | B | B | — | B |
| Adhesiveness (Ag) | G | G | — | G |

As shown in Table 2, the composition of Comparative Example 1 which lacked the unit —$O_{1/2}Si(R^1)_2$—$R^2$—Si$(R^1)_2O_{1/2}$— had poor resin strength and curability, caused cracks upon heat treatment, and contained substantial amounts of volatiles. The composition of Comparative Example 2 which comprised of less than 10 mol % of the unit —$O_{1/2}Si(R^1)_2$—$R^2$—Si$(R^1)_2O_{1/2}$— had poor curability, and caused cracks upon heat treatment. The composition of Comparative Example 3 did not cure, which lacked the $R^1SiO_{3/2}$ unit and comprised an organopolysiloxane having a ratio of the weight average molecular weight (Mw) to the number average molecular weight (Mn) of less than 1.5 in place of component (A). The composition of Comparative Example 4, which comprised an organopolysiloxane having a ratio of the weight average molecular weight (Mw) to the number average molecular weight (Mn) of less than 1.5 in place of component (A), was slow in curing, and caused voids upon curing to give a fragile resin.

In contrast, as shown in Table 1, the curable organopolysiloxane compositions according to the invention were colorless and transparent, and had excellent curability, and the cured products obtained from these compositions had sufficient hardnesses, elongations at break and tensile strengths, as well as good refractive indexes, heat resistance, crack resistance and adhesiveness, and did not show any dust deposition due to surface tackiness.

INDUSTRIAL APPLICABILITY

The curable organopolysiloxane composition according to the invention can be cured promptly to yield a cured product having good optical transparency, heat resistance, mechanical properties, crack resistance and adhesiveness. The composition according to the invention also provides a cured product with minimum surface tackiness. Accordingly, the composition according to the invention can be suitably used as a composition for encapsulating a semiconductor element to provide a highly reliable semiconductor device.

LIST OF THE PRIOR ART REFERENCES

1. JP 2011-219729A
2. JP 2016-008246A
3. JP 2007-119569A

The invention claimed is:

1. A curable organopolysiloxane composition comprising the following components:

(A) an organopolysiloxane comprising at least 10 mol %, based on total moles of siloxane units, of a siloxane unit of the following formula (1):

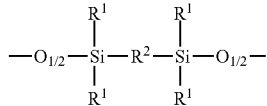

(1)

wherein $R^1$ is, independently at each occurrence, a monovalent hydrocarbon group having 1 to 10 carbon atoms, and $R^2$ is a divalent aromatic group having 6 to 50 carbon atoms and optionally comprising a silylene group or a siloxane linkage, and 10 to 90 mol % of $R^1SiO_{3/2}$ unit, the organopolysiloxane having a weight average molecular weight (Mw) of from 2,000 to 100,000, as determined by gel permeation chromatography relative to polystyrene standards, and a ratio of the weight average molecular weight (Mw) to the number average molecular weight (Mn) of at least 1.5; and (B) a catalytic amount of a basic catalyst.

2. The curable organopolysiloxane composition according to claim 1, wherein said component (A) comprises an alkoxy group bonded to a silicon atom in an amount ranging from 0.001 to 2 mol/100 g, and a hydroxyl group bonded to a silicon atom in an amount of from 0 mol/100 g to 1.0 mol/100 g.

3. The curable organopolysiloxane composition according to claim 1 or 2, further comprising:

(C) at most 50 parts by mass, relative to 100 parts by mass of component (A), of a linear organopolysiloxane of the following formula (2):

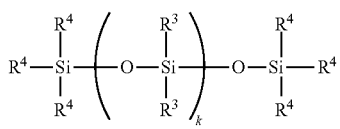 (2)

wherein k is an integer of 1 to 10,000, $R^3$ is, independently at each occurrence, a monovalent hydrocarbon group having 1 to 10 carbon atoms, and $R^4$ is, independently at each occurrence, a group selected from a hydroxyl group, an alkoxy group having 1 to 10 carbon atoms, and a monovalent hydrocarbon group having 1 to 10 carbon atoms, or a hydrogen atom.

4. The curable organopolysiloxane composition according to claim 1, further comprising
(D) 0.1 to 30 parts by mass, relative to 100 parts by mass of component (A), of an organosilicon compound of the following formula (3):

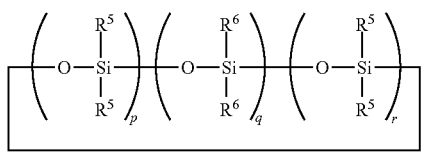 (3)

wherein $R^5$ is, independently at each occurrence, a monovalent aliphatic hydrocarbon group having 1 to 10 carbon atoms, $R^6$ is, independently at each occurrence, a monovalent aromatic hydrocarbon group having 6 to 10 carbon atoms, and p, q and r are, independently from each other, an integer of 0 to 4, provided that p+q+r equals to 3 or 4.

5. The curable organopolysiloxane composition according to claim 1, wherein the organopolysiloxane (A) has two or more maxima in a molecular weight distribution curve obtained by GPC, at least one of the maxima being on a side of a molecular weight of 5,000 or more, and at least one of the maxima being on a side of a molecular weight of 3,000 or less.

6. The curable organopolysiloxane composition according to claim 1, wherein the ratio of the area of a peak having a maximum on a side of a molecular weight of 5,000 or more to the area of a peak having a maximum on a side of a molecular weight of 3,000 or less in a molecular weight distribution curve of the organopolysiloxane (A) is from 5:95 to 90:10, provided that if two peaks overlap with each other, a perpendicular line at a minimum between the two peaks divides the areas of the two peaks.

7. The curable organopolysiloxane composition according to claim 1, wherein a time for the composition in a liquid state to gelate at 150° C. is less than 300 seconds.

8. The curable organopolysiloxane composition according to claim 1, wherein a weight loss upon heating at 150° C. for one hour is less than 10% by weight, relative to the weight of the composition before the heating.

9. A semiconductor device comprising a cured product of the curable organopolysiloxane composition according to claim 1.

* * * * *